US006586272B1

(12) United States Patent
Song

(10) Patent No.: US 6,586,272 B1
(45) Date of Patent: Jul. 1, 2003

(54) METHOD FOR MANUFACTURING MSM PHOTODETECTOR OR USING A HEMT STRUCTURE INCORPORATING A LOW-TEMPERATURE GROWN SEMICONDUCTOR

(75) Inventor: Jong In Song, Buk-Gu (KR)

(73) Assignee: Kwangju Institute of Science and Technology, Buk-Gu (KR)

( * ) Notice: Subject to any disclaimer, the term of this patent is extended or adjusted under 35 U.S.C. 154(b) by 0 days.

(21) Appl. No.: 10/116,339

(22) Filed: Apr. 3, 2002

(30) Foreign Application Priority Data

Dec. 26, 2001 (KR) .......................... 2001-84876

(51) Int. Cl.⁷ ............................................. H01L 21/00
(52) U.S. Cl. ........................................... 438/94; 257/184
(58) Field of Search ........................ 438/94; 257/184, 257/200, 201

(56) References Cited

U.S. PATENT DOCUMENTS 5,364,816 A * 11/1994 Boos et al. ............... 437/133
6,252,287 B1 * 6/2001 Kurtz et al. ............... 257/461
6,465,812 B1 * 10/2002 Hosoba et al. ............ 257/103
6,515,316 B1 * 2/2003 Wojtowicz et al. ........ 257/194

* cited by examiner

Primary Examiner—David Nelms
Assistant Examiner—Quoc Hoang
(74) Attorney, Agent, or Firm—Harness, Dickey & Pierce, PLC

(57) ABSTRACT

The present invention relates to the method for manufacturing an MSM photodetector using a HEMT structure incorporating a low-temperature grown semiconductor. The object of the present invention is to improve the speed characteristic of an MSM photodetector by using a HEMT structure incorporating a low-temperature grown semiconductor.

The use of a HEMT structure incorporating a low-temperature grown semiconductor can reduce the number of holes reaching the metal electrode of MSM detectors, resulting in reduced hole current. As a result, the photocurrent response of the MSM detector using a HEMT structure incorporating a low-temperature grown semiconductor is dominated by electron current, resulting in a significant improvement in speed performance.

15 Claims, 6 Drawing Sheets

METHOD FOR MANUFACTURING MSM PHOTODETECTOR OR USING A HEMT STRUCTURE INCORPORATING A LOW-TEMPERATURE GROWN SEMICONDUCTOR

BACKGROUND OF THE INVENTION

The present invention relates to the method for manufacturing a Metal-Semiconductor-Metal (MSM) photodetector using a HEMT structure incorporating a low-temperature grown semiconductor. MSM photodetectors are widely used as a key component for optical receivers in ultra-high speed optical communication systems and for optoelectronic transducers in microwave/millimeter-wave optical communication systems.

Photodetectors perform the function of converting optical signals to electrical signals. MSM photodetectors are one of many candidates for ultra-high speed photodetectors and are widely used due to their excellent speed performance. They are also easy for monolithic integration (opto-electronic integrated circuit: OEIC) with electronic devices including FETs (field effect transistors) and HEMTs (high electron mobility transistors) since they are planar in structure.

The epitaxial layer structure and schematic cross section of conventional MSM photodetectors are illustrated in FIG. 1a and FIG. 1b, respectively. The cross section and the energy band diagram of conventional MSM photodetectors are also illustrated in FIG. 2a and FIG. 2bb, respectively. Here, the first epitaxial layer 10 is a semi-insulating substrate, the second epitaxial layer 12 is a photo-absorption layer, and the third epitaxial layer 14 is a Schottky barrier layer.

In general, the Schottky barrier layer is composed of an n-type semiconductor having a larger band gap energy than that of the photo-absorption layer. The Schottky barrier layer is transparent to optical signals that are absorbed in the photo-absorption layer and plays a role of reducing the leakage current (or dark current) in MSM photodetectors. The photo-absorption layer is composed of a lightly n-doped semiconductor that has a lower band gap energy than that of the Schottky barrier layer and absorbs the photons incident upon the photodetector, generating and transporting electron-hole pairs.

The two main factors that determine the speed performance of a photodetector are the RC time constant ($\tau_{RC}$) that is dependent on the resistance and capacitance of the photodetector and the transit time ($\tau_T$) that is the time taken for an electron or a hole to reach the metal electrode via a photo-absorption layer along the applied electric field (the transport length L and the direction of the electric field are shown in FIG. 1b).

In order to maximize the speed performance of a photodetector, these two factors must be optimized. In practice, the RC time constant ($\tau_{RC}$) of an ultra-high speed photodetector is designed to have a significantly smaller value than the transit time ($\tau_T$) and thus the speed performance is determined by the transit time of photo-generated electrons and holes.

Photons incident on the photo-absorption layer of a photodetector generate electron-hole pairs. The photo-generated electrons and holes travel in opposite directions according to the direction of electric field applied and reach the Schottky metal electrode, subsequently constituting electron and hole currents, respectively.

In general, the speed of electrons and holes in most of semiconductors is different. In fact, the speed of electron is much faster than that of hole. This is due to the difference in their effective mass. For example, in the case of $In_{0.53}Ga_{0.47}As$ that is lattice-matched to InP substrate and used for detecting an optical signal having a wavelength of 1.5 μm, the effective mass $m_e$ of an electron is 0.041 $m_o$ whereas the effective mass $m_h$ of a hole is 0.46 $m_o$ (Here $m_o$ is the mass of a free electron). This shows that the effective mass of a hole is 10 times heavier than that of an electron.

FIG. 3 shows the photo-current response of conventional MSM photodetectors when an impulse-type optical signal is incident upon them. The total current here consists of electron and hole currents. The different pulse width of the electron current and the hole current is due to difference in speed of electrons and holes in semiconductors.

Consequently, the speed performance of MSM photodetectors, more specifically, the frequency bandwidth is determined by the speed characteristic of the holes. This can be represented quantitatively as follows.

If the time taken for an electron and a hole to travel through a photo-absorption layer (L in FIG. 1b) is $\tau_e$ and $\tau_h$, respectively, then the frequency bandwidth of the photodetector B can be represent as;

$$B = 1/2\pi(\tau_e + \tau_h) \qquad \text{[Mathematical Equation 1]}$$

$$B \sim 1(2\pi\tau_h) \text{ since } \tau_e < \tau_h$$

As a result, it can be seen that the speed performance of MSM photodetectors is determined by the speed characteristic of holes. Accordingly, in order to improve the speed performance of MSM photodetectors the photocurrent response due to heles has to be modified.

SUMMARY OF THE INVENTION

In general, the photocurrent response of an MSM photodetector consists of electron current and hole current originating from the equal number of electrons and holes generated by photons. The hole current acts as a limiting factor for the speed performance of an MSM photodetector due to the low hole mobility (or speed). This speed performance limitation can be overcome by suppressing the magnitude of the hole current, making the electron current a dominant part of the total photocurrent of an MSM detector. Suppression of the hole current can be achieved by reducing the number of holes reaching the metal electrode.

FIG. 2b illustrates the operation principle of a conventional MSM photodetector. In FIG. 2b, the holes generated in the photo-absorption layer move upward (toward the metal electrode) due to the applied electric field. Since the direction of the electric field is aiding transport of the holes to the metal electrode the probability of the holes being converted to photocurrent increases. On the contrary, the electrons move downward (away from the metal electrode) due to the applied electric field. Since the direction of the electric field is hampering transport of the electrons to the metal electrode the probability of the electrons being converted to photocurrent decreases.

The object of the present invention is to improve the speed performance of an MSM photodetector by reducing the magnitude of the hole current. Reduction in the magnitude of the hole current can be achieved by deducing the probability of the holes generated in the photo-absorption layer eventually reaching the metal electrode. This objective is achieved by using an energy band structure constructed by a modified HEMT structure and a low-temperature grown compound semiconductor.

In order to achieve the object of the present invention, the method for manufacturing an MSM photodetector using a GaAs-based delta-doped HEMT structure according to the present invention comprises the steps of: forming an undoped $Al_xGa_{1-x}As$ ($0 \leq x \leq 0.4$) buffer layer which is grown on a GaAs semi-insulated substrate; forming an undoped low temperature grown $In_xGa_{1-x}As$ ($0 \leq x \leq 0.3$) epitaxial layer on said $Al_xGa_{1-x}As$ buffer layer; forming a p-type GaAs first photo-absorption layer which is grown on said low-temperature grown $In_xGa_{1-x}As$ layer; forming an undoped GaAs second photo-absorption layer which is grown on said GaAs first photo-absorption layer; forming an undoped $Al_xGa_{1-x}As$ ($0 \leq x \leq 0.4$) first barrier layer which is grown on said undoped GaAs second photo-absorption layer; forming an n-type delta-doped $Al_xGa_{1-x}As$ ($0 \leq x \leq 0.4$) second barrier layer which is grown on said undoped $Al_xGa_{1-x}As$ ($0 \leq x \leq 0.4$) first barrier layer; and forming an undoped $Al_xGa_{1-x}As$ ($0 \leq x \leq 0.4$) third barrier layer which is grown on said n-type delta-doped $Al_xGa_{1-x}As$ ($0 \leq x \leq 0.4$) second barrier layer.

BRIEF DESCRIPTION OF THE DRAWINGS

FIG. 2a and FIG. 2b illustrate the device cross section and energy band diagram of a conventional MSM photodetector.

DETAILED DESCRIPTION OF THE EMBODIMENTS

Hereinafter, preferred embodiments of the present invention will be described in detail with reference to the accompanying drawings.

Figure 4A:
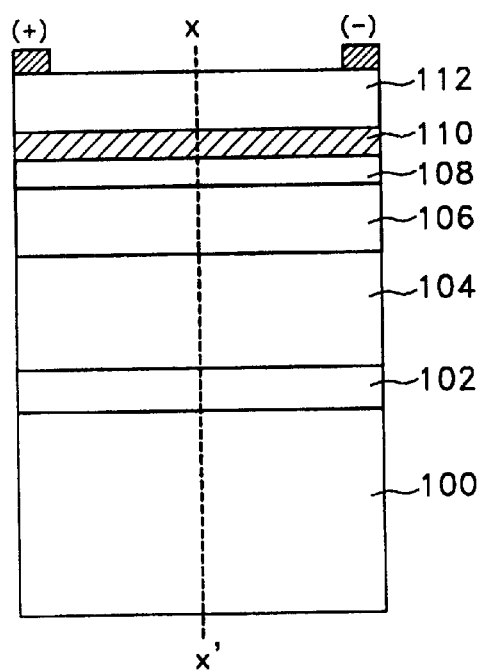
FIG. 4a and FIG. 4b illustrate the epitaxial layer structure and energy band diagram (in the absence of optical signals) of the MSM photodetector according to the present invention.
Figure 4B:
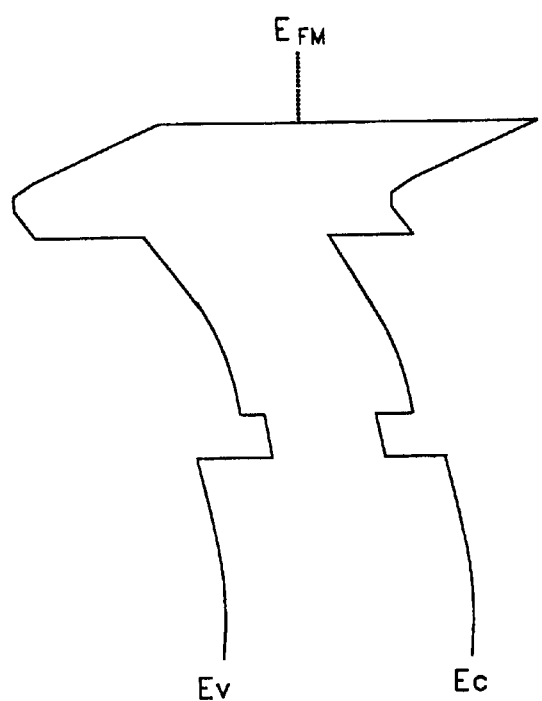

The structure of an MSM photodetector according to the present invention (HEMT structure with a delta-doped barrier layer) and energy band diagram are described in FIG. 4a, FIG. 4b, FIG. 5a, and FIG. 5b. In FIG. 4a and FIG. 4b, the input optical signal is absent whereas in FIG. 5a and FIG. 5b, the input optical signal is present.

The epitaxial structures of the photodetector illustrated in FIG. 4aFIG. 4b, FIG. 5a and FIG. 5b show that the first epitaxial layer 100 is a buffer layer which is grown on a semi-insulating substrate.

The second epitaxial layer 102 which is grown on the buffer layer consists of a material which has smaller band gap energy than those of the first epitaxial layer 100 (a buffer layer) and the third epitaxial layer 104 (a photo-absorption layer).

Since the second epitaxial layer 102 has a smaller band gap energy than that of the first epitaxial layer 100 (a buffer layer) and the third epitaxial layer 104 (a photo-absorption layer), it can effectively trap the holes generated in the photo-absorption layer.

Also, since the growth temperature of this layer is significantly lower than that of other layers within the photodetector structure, the life time of electrons and holes trapped within the layer gets extremely short. Therefore, the holes trapped within this epitaxial layer are rapidly removed by recombining with thermally generated electrons, resulting in a reduced hole current of the MSM photodetector.

Figure 5A:
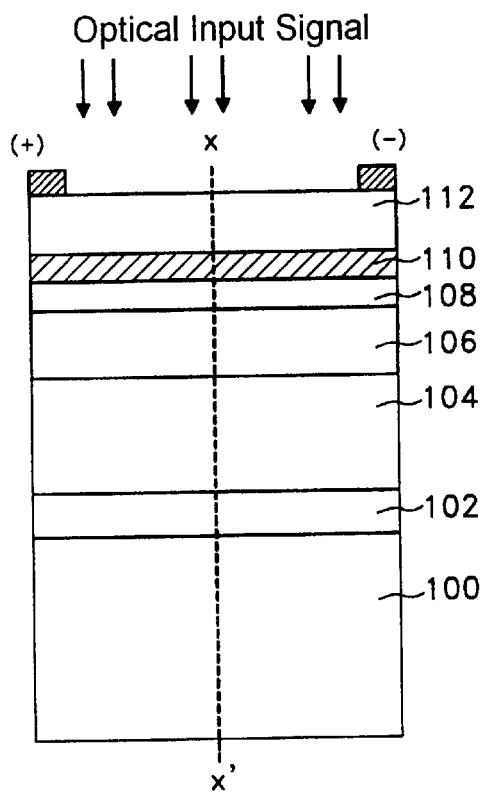
FIG. 5a and FIG. 5b illustrate the epitaxial layer structure and energy band diagram (in the presence of optical signals) of the MSM photodetector according to the present invention.
Figure 5B:
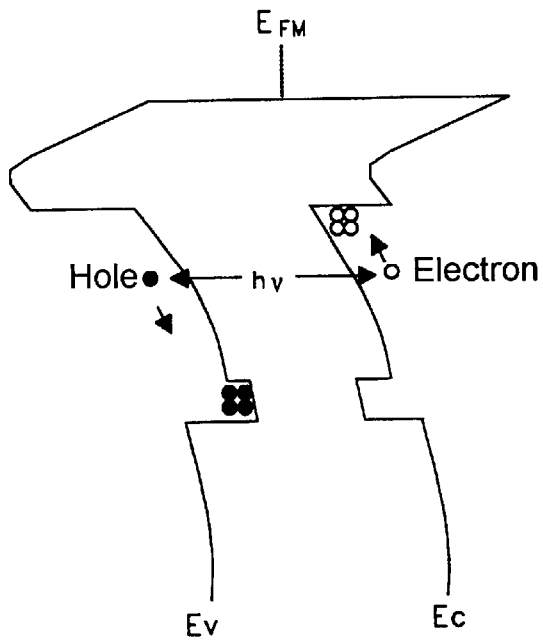

The third epitaxial layer 104 is a p-doped photo-absorption layer. This layer absorbs incident photons generating electron-hole pairs and is also used as a medium for electron and hole transport. The p-type doping concentration of the third epitaxial layer 104 should be low enough for this layer to be completely depleted at the operating bias voltage. As shown in FIG. 5b, the depleted p-type impurity $NA_A^+$ within the third epitaxial layer 104 generates an electric field profile that moves the photo-generated electrons toward the metal electrode and the photo-generated holes away from the metal electrode, helping to suppress the hole current of the MSM photodetector.

Likewise, the fourth epitaxial layer 106 that is grown on the third epitaxial layer 104 is a part of the photo-absorption layer. It plays a role of generating and transporting the photo-generated electron-hole pairs. This layer is undoped so that electrons can be transported with high mobility (or speed).

The electrons generated from the photo-absorption layers (104 and 106) accumulate at the interface of the fourth epitaxial layer 106 and the fifth epitaxial layer 108 due to the electric field generated by the p-doped absorption layer 104, forming a two dimensional electron gas (2DEG). The electrons in 2DEG form are transported to the metal electrode. The reason for not doping the fourth epitaxial layer 106 is to reduce the impurity scattering phenomena so that the electron mobility can be maximized in this layer.

The fifth epitaxial layer 108, which is grown on the fourth epitaxial layer 106, is an undoped barrier layer and consists of a semiconductor having a larger band gap energy than that of the third epitaxial layer 104 and fourth epitaxial layer 106. It is transparent to the input optical signal. The role of this undoped barrier layer 108 is to keep the 2DEG in the absorption layer 106 away from the ionized donor in the n-doped barrier layer 110, reducing the impurity scattering and thus improving mobility of the 2DEG.

The sixth epitaxial layer 110, which is grown on the fifth epitaxial layer 108, is an n-type delta-doped barrier layer. It consists of a semiconductor having a large band gap energy like the fifth epitaxial layer 108.

The role of n-type impurities in this epitaxial layer in combination with the p-type impurity in the third crystal layer 104 is to construct the energy band diagrams illustrated in FIG. 4b and FIG. 5b. The shape of the energy band diagram is constructed in such a way that the photo-generated electrons can easily move toward the metal electrode and the photo-generated holes can easily move away from the metal electrode into the low-temperature grown epitaxial layer 102. Thus, the photo-generated electron current component is enhanced while the photo-generated hole current component is effectively suppressed.

The seventh epitaxial layer 112, which is grown on the sixth epitaxial layer 110, is an undoped barrier layer. It consists of a material that has a large band gap energy like other barrier layers (layer 108 and 110). The total thickness of the barrier layers including the fifth 108, the sixth 110, and the seventh 112 epitaxial layers, the location of the sixth epitaxial layer 110, and the n-type doping concentration of the sixth epitaxial layer 110 determine the density of the two dimensional electron gas that is formed in the channel layer (layer 106) of the HEMT structure in equilibrium state. For MSM photodetector application, the HEMT structure according to the present invention has to be designed for enhancement mode operation, where the density of two dimensional electron gas formed in the channel layer (layer 106) in equilibrium state is zero (more specifically, the threshold voltage $V_{Th}$ of the HEMT structure has a positive value).

Hereafter, more details on manufacturing of the MSM photodetector according to the present invention will be provided with reference to the preferred embodiments 1, 2, and 3. It should also be noted that description of the numeric on the parts of the drawings are identical to those in FIG. 4a and FIG. 5a.

<Embodiment 1>

The method for manufacturing an MSM photodetector using a GaAs-based delta-doped HEMT structure according to the present invention comprises the steps of: forming an undoped AlxGa1-xAs ($0 \leq x \leq 0.4$) buffer layer 100 which is grown on a GaAs semi-insulating substrate; forming an undoped low-temperature grown InxGa1-xAs ($0 \leq x \leq 0.3$) epitaxial layer 102 on said AlxGa1-xAs buffer layer; forming a p-type GaAs first photo-absorption layer 104 which is grown on said low-temperature grown InxGa1-xAs layer 102; forming an undoped GaAs second photo-absorption layer 106 which is grown on said GaAs first photo-absorption layer 104; forming an undoped AlxGa1-xAs ($0 \leq x \leq 0.4$) first barrier layer 108 which is grown on said undoped GaAs second photo-absorption layer 106; forming an n-type delta-doped AlxGa1-xAs ($0 \leq x \leq 0.4$) second barrier layer 110 which is grown on said undoped AlxGa1-xAs ($0 \leq x \leq 0.4$) first barrier layer 108; and forming an undoped AlxGa1-xAs ($0 \leq x \leq 0.4$) third barrier layer 112 which is grown on said delta-doped AlxGa1-xAs ($0 \leq x \leq 0.4$) second barrier layer 110.

A uniform-doped HEMT structure, where said AlxGa1-xAs second barrier layer 110 and said AlxGa1-xAs third barrier layer 112 are uniformly n-doped, can be used. Also, combination of delta- and uniform-doped HEMT structure, where said AlxGa1-xAs second barrier layer 110 is n-type delta-doped and said AlxGa1-xAs third barrier layer 112 is uniformly n-doped, can be used. In the above structures, InxGa1-xP(x~0.5) layer can be used instead of AlxGa1-xAs barrier layers (layers 108, 110, and 112).

<Embodiment 2>

The method for manufacturing a MSM photodetector using an InP-based delta-doped HEMT structure according to the present invention comprises the steps of: forming an undoped InP or In0.52Al0.48As buffer layer 100 which is grown on an InP semi-insulating substrate; forming an undoped low-temperature grown InxGa1-xAs ($x \geq 0.53$) epitaxial layer 102 on said InP or In0.52Al0.48As buffer layer 100; forming a p-type InxGa1-xAs ($x \geq 0.53$) first photo-absorption layer 104 which is grown on said low-temperature grown InxGa1-xAs ($x \geq 0.53$) epitaxial layer 102; forming an undoped InxGa1-xAs (x=0.53) second photo-absorption layer 106 which is grown on said InxGa1-xAs first photo-absorption layer 104; forming an undoped InxAl1-xAs (x=0.52) first barrier layer 108 which is grown on said undoped InxGa1-xAs (x=0.53) second photo-absorption layer 106; forming an n-type delta-doped InxAl1-xAs (x=0.52) second barrier layer 110 which is grown on said undoped InxAl1-xAs (x=0.52) first barrier layer 108; and forming an undoped InxAl1-xAs (x=0.52) third barrier layer 112 which is grown on said n-type delta-doped InxAl1-xAs (x=0.52) second barrier layer 110.

A uniform-doped HEMT structure, where said InxAl1-xAs second barrier layer 110 and said InxAl1-xAs third barrier layer 112 are uniformly n-doped, can be used. Also, combination of delta- and uniform-doped HEMT structure, where said InxAl1-xAs second barrier layer 110 is n-type delta-doped and said InxAl1-xAs third barrier layer 112 is uniformly n-doped, can be used.

<Embodiment 3>

The method for manufacturing an MSM photodetector using a GaN-based delta-doped HEMT structure according to the present invention comprises the steps of: forming an undoped AlxGa1-xN ($0 \leq x \leq 0.4$) buffer layer 100 which is grown on a Sapphire or GaN substrate; forming an undoped low-temperature grown InxGa1-xN ($0 \leq x$) epitaxial layer 102 on said AlxGa1-xN ($0 \leq x0.4$) buffer layer 100; forming a p-type GaN first photo-absorption layer 104 which is grown on said low-temperature grown InxGa1-xN ($0 \leq x$) epitaxial layer 102; forming an undoped GaN second photo-absorption layer 106 which is grown on said GaN first photo-absorption layer 104; forming an undoped AlxGa1-xN ($0.05 \leq x \leq 0.4$) first barrier layer 108 which is grown on said undoped GaN second photo-absorption layer 106; forming an delta-doped AlxGa1-xN ($0.05 \leq x \leq 0.4$) second barrier layer 110 which is grown on said undoped AlxGa1-xN ($0.05 \leq x \leq 0.4$) first barrier layer 108; and forming an undoped AlxGa1-xN ($0.05 \leq x \leq 0.4$) third barrier layer 112 which is grown on said delta-doped AlxGa1-xN ($0.05 \leq x \leq 0.4$) second barrier layer 110.

A uniform-doped HEMT structure, where said AlxGa1-xN second barrier layer 110 and said AlxGa1-xN third barrier layer 112 are uniformly n-doped, can be used. Also, combination of delta- and uniform-doped HEMT structure, where said AlxGa1-xN second barrier layer 110 is n-type delta-doped and said AlxGa1-xN third barrier layer 112 is uniformly n-doped, can be used.

Figure 1A:
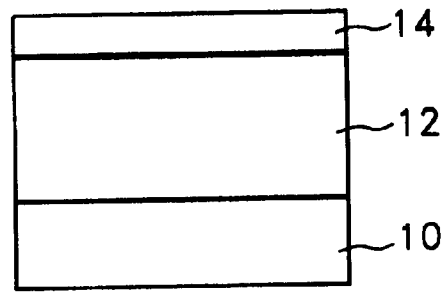
FIG. 1a and FIG. 2b illustrate the epitaxial layer structure and device cross section of a conventional MSM photodetector.
Figure 1B:
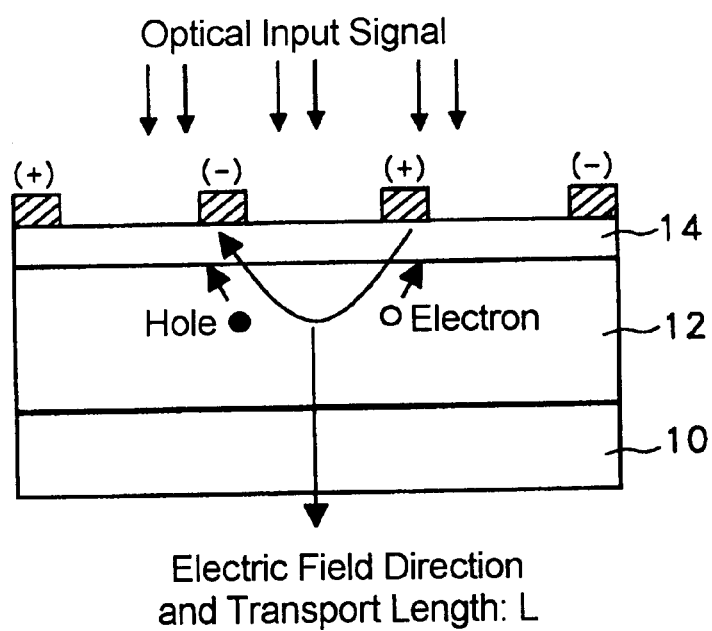
Figure 2A:
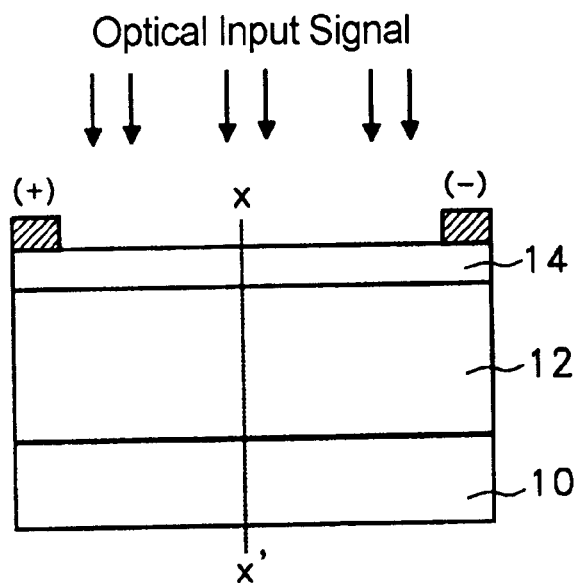
Figure 2B:
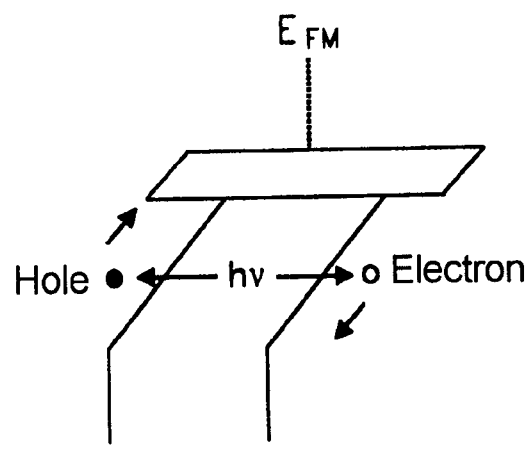
Figure 3:
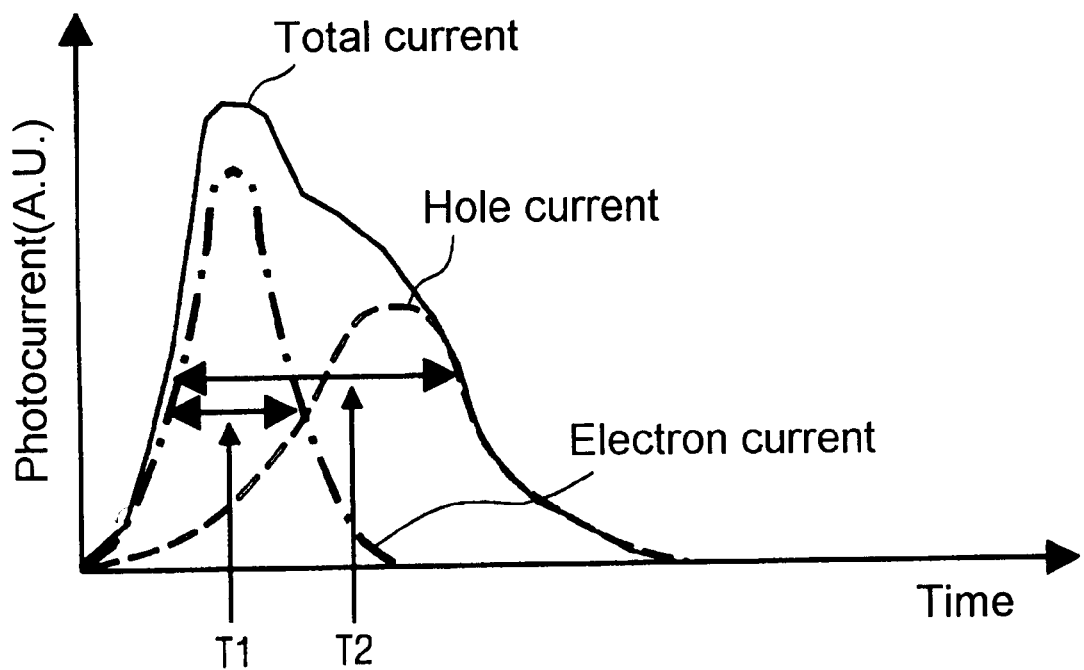
FIG. 3 shows the responses of total photocurrent, electron current, and hole current of a conventional MSM photodetector.

As described so far, whereas the conventional MSM photodetector uses a very low n-type doped barrier layer (the third crystal layer in FIG. 1a and FIG. 2a), the present invention uses a uniform or delta-doped HEMT structure barrier layer.

Figure 6:
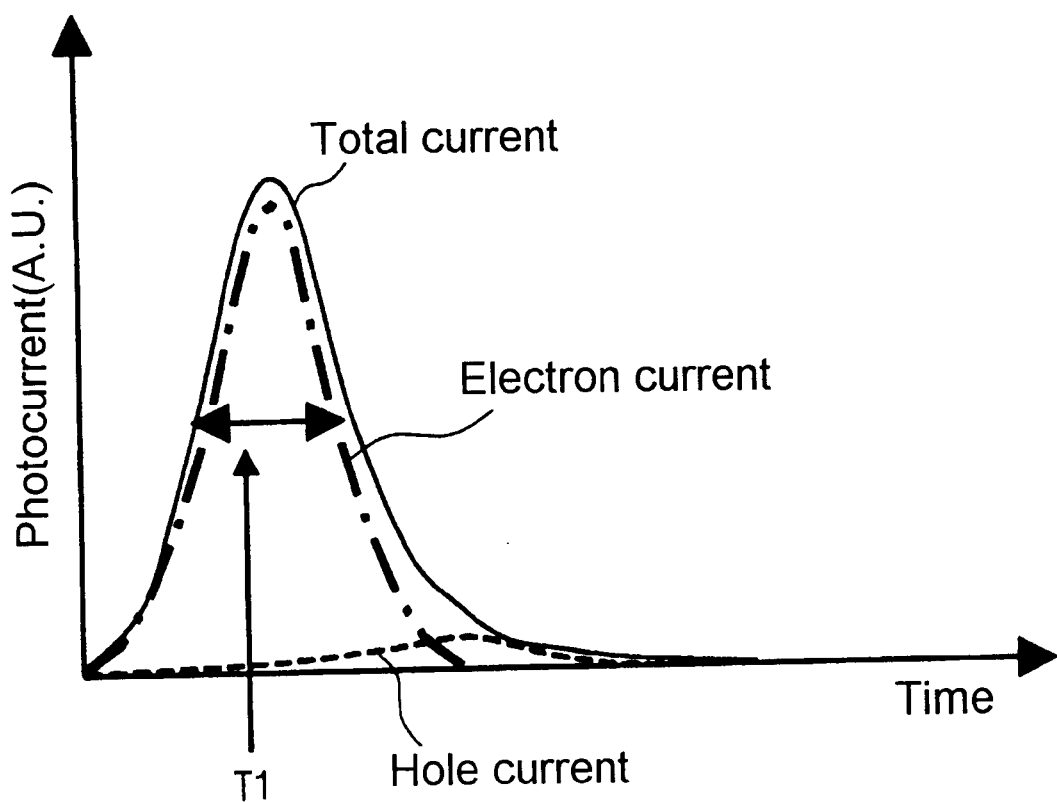
FIG. 6 shows the responses of total photocurrent, electron current, and hole current of the MSM photodetector according to the present invention.

The energy band structure of the MSM photodetector using a HEMT structure incorporating a low-temperature grown semiconductor according to the present invention can significantly reduce the photocurrent component by the holes. The effect of reduction in the hole current component on the overall speed performance of the MSM photodetector is shown in FIG. 6.

Since the MSM photodetector according to the present invention has a much wider frequency bandwidth compared with the conventional MSM photodetector, it can be used for high-speed optical communication systems and microwave/millimeter-wave optical communication systems having a broader bandwidth.

What is claimed is:

1. A method for manufacturing an MSM photodetector using a GaAs-based delta-doped HEMT structure according to the present invention, comprising the steps of:

forming an undoped AlxGa1-xAs ($0 \leq x \leq 0.4$) buffer layer 100 which is grown on a GaAs semi-insulating substrate;

forming an undoped low-temperature grown InxGa1-xAs ($0 \leq x \leq 0.3$) crystal layer 102 on said AlxGa1-xAs buffer layer 100;

forming a p-type GaAs first photo-absorption layer 104 which is grown on said low-temperature grown InxGa1-xAs layer 102;

forming an undoped GaAs second photo-absorption layer 106 which is grown on said GaAs first photo-absorption layer 104;

forming an undoped AlxGa1-xAs ($0 \leq x \leq 0.4$) first barrier layer 108 which is grown on said undoped GaAs second photo-absorption layer 106;

forming a highly n-type delta-doped AlxGa1-xAs ($0 \leq x \leq 0.4$) second barrier layer 110 which is grown on said undoped AlxGa1-xAs ($0 \leq x \leq 0.4$) first barrier layer 108; and forming an undoped AlxGa1-xAs ($0 \leq x \leq 0.4$) third barrier layer 112 which is grown on said highly n-type delta-doped AlxGa1-xAs ($0 \leq x \leq 0.4$) second barrier layer 110.

2. The method as claimed in claim 1 wherein said AlxGa1-xAs second barrier layer 110 is highly n-type delta-doped and said AlxGa1-xAs third barrier layer 112 is uniformly n-doped.

3. The method as claimed in claim 1 wherein said AlxGa1-xAs second barrier layer 110 and said AlxGa1-xAs third barrier layer 112 are uniformly n-doped.

4. The method as claimed in claim 3 wherein instead of using said AlxGa1-xAs barrier layers (layers 108, 110, and 112) InxGa1-xP(x~0.5) barrier layers are used.

5. The method as claimed in claim 1 wherein instead of using said AlxGa1-xAs barrier layers (layers 108, 110, and 112) InxGa1-xP(x~0.5) barrier layers are used.

6. The method as claimed in claim 2 wherein instead of using said AlxGa1-xAs barrier layers (layers 108, 110, and 112) InxGa1-xP(x~0.5) barrier layers are used.

7. A method for manufacturing an MSM photodetector using an InP-based delta-doped HEMT structure according to the present invention, comprising the steps of:

forming an undoped InP buffer layer 100 which is grown on an InP semi-insulating substrate;

forming an undoped low-temperature grown InxGa1-xAs ($0.53 \leq x$) layer 102 on said InP buffer layer 100;

forming a p-type InxGa1-xAs (x=0.53) first photo-absorption layer 104 which is grown on said low-temperature grown InxGa1-xAs (x=0.53) layer 102;

forming an undoped InxGa1-xAs (x=0.53) second photo-absorption layer 106 which is grown on said InxGa1-xAs first photo-absorption layer 104;

forming an undoped InxAl1-xAs (x=0.52) first barrier layer 108 which is grown on said undoped InxGa1-xAs (x=0.53) second photo-absorption layer 106;

forming a highly n-type delta-doped InxAl1-xAs (x=0.52) second barrier layer 110 which is grown on said undoped InxAl1-xAs (x=0.52) first barrier layer 108; and forming an undoped InxAl1-xAs (x=0.52) third barrier layer 112 which is grown on said highly n-type delta-doped InxAl1-xAs (x=0.52) second barrier layer 110.

8. The method as claimed in claim 7 wherein said InxAl1-xAs second barrier layer 110 is highly n-type delta-doped and said InxAl1-xAs third barrier layer 112 is uniformly n-doped.

9. The method as claimed in claim 8 wherein instead of using said InP buffer layer 100, an In0.52Al0.48As buffer layer is used.

10. The method as claimed in claim 7 wherein said InxAl1-xAs second barrier layer 110 and said InxAl1-xAs third barrier layer 112 are uniformly n-doped.

11. The method as claimed in claim 10 wherein instead of using said InP buffer layer 100, an In0.52Al0.48As buffer layer is used.

12. The method as claimed in claim 7 wherein instead of using said InP buffer layer 100, an In0.52Al0.48As buffer layer is used.

13. A method for manufacturing an MSM photodetector using a GaN-based delta-doped HEMT structure according to the present invention, comprising the steps of:

forming an undoped AlxGa1-xN ($0 \leq x \leq 0.4$) buffer layer 100 which is grown on a Sapphire or GaN substrate;

forming an undoped low-temperature grown InxGa1-xN ($0 \leq x$) layer 102 on said AlxGa1-xN ($0 \leq x \leq 0.4$) buffer layer 100;

forming a p-type GaN first photo-absorption layer 104 which is grown on said low-temperature grown InxGa1-xN ($0 \leq x$) layer 102;

forming an undoped GaN second photo-absorption layer 106 which is grown on said p-type GaN first photo-absorption layer 104;

forming an undoped AlxGa1-xN ($0.05 \leq x \leq 0.4$) first barrier layer 108 which is grown on said undoped GaN second photo-absorption layer 106;

forming a highly n-type delta-doped AlxGa1-xN ($0.05 \leq x \leq 0.4$) second barrier layer 110 which is grown on said undoped AlxGa1-xN ($0.05 \leq x \leq 0.4$) first barrier layer 108; and forming an undoped AlxGa1-xN ($0.05 \leq x \leq 0.4$) third barrier layer 112 which is grown on said highly n-type delta-doped AlxGa1-xN ($0.05 \leq x \leq 0.4$) second barrier layer 110.

14. The method as claimed in claim 13 wherein said AlxGa1-xN second barrier layer 110 is highly n-type delta-doped and said AlxGa1-xN third barrier layer 112 is uniformly n-doped.

15. The method as claimed in claim 13 wherein said AlxGa1-xN second barrier layer 110 and said AlxGa1-xN third barrier layer 112 are uniformly n-doped.

* * * * *